(12) United States Patent
Belady et al.

(10) Patent No.: US 11,639,831 B2
(45) Date of Patent: May 2, 2023

(54) WATER SCAVENGING SYSTEM FOR DATACENTER COOLING SYSTEMS

(71) Applicant: MICROSOFT TECHNOLOGY LICENSING, LLC, Redmond, WA (US)

(72) Inventors: Christian L. Belady, Mercer Island, WA (US); David Thomas Gauthier, Seattle, WA (US); Sean M. James, Olympia, WA (US); Brian Addams Janous, Issaquah, WA (US); Mark Alan Monroe, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 855 days.

(21) Appl. No.: 16/399,666

(22) Filed: Apr. 30, 2019

(65) Prior Publication Data
US 2019/0339030 A1 Nov. 7, 2019

Related U.S. Application Data

(60) Provisional application No. 62/665,971, filed on May 2, 2018.

(51) Int. Cl.
*F28F 27/00* (2006.01)
*F28F 17/00* (2006.01)
(Continued)

(52) U.S. Cl.
CPC ............ *F28F 17/005* (2013.01); *F28F 27/00* (2013.01); *H01M 8/04701* (2013.01); *H05K 7/20745* (2013.01); *H01M 2250/10* (2013.01)

(58) Field of Classification Search
CPC .... F28F 17/005; F28F 27/00; H01M 8/04701; H01M 2250/10; H01M 8/04291;
(Continued)

(56) References Cited

U.S. PATENT DOCUMENTS

| 8,427,831 B2 | 4/2013 | Wei |
| 9,585,291 B2 | 2/2017 | Belady et al. |

(Continued)

FOREIGN PATENT DOCUMENTS

| CN | 205356937 U | 6/2016 |
| JP | 2011058671 A | 3/2011 |
| WO | 2014164799 A1 | 10/2014 |

OTHER PUBLICATIONS

"Absorption Chillers: Heat Into Cooling", Retrieved from: https://web.archive.org/web/20091213033535/http://www.datacenterknowledge.com/inside-ibms-greenest-data-center/absorption-chillers-heat-into-cooling, Dec. 13, 2009, 3 Pages.

(Continued)

*Primary Examiner* — Frantz F Jules
*Assistant Examiner* — Martha Tadesse
(74) *Attorney, Agent, or Firm* — Workman Nydegger

(57) ABSTRACT

Cooling a first device and second device in a fashion to produce water. The method includes collecting environmental air from an environment. The environmental air is used to cool a first device. Cooling the first device generates first device exhaust air produced from the environmental air. The first device exhaust air is provided to a first device portion of a heat exchanger. At a second device portion of the heat exchanger, thermally coupled to the first device portion of the heat exchanger, second device exhaust air generated by cooling a second device is received. At the heat exchanger, the first device exhaust air is used to cool the second device exhaust air to a dew point, causing condensed water to be created from the second device exhaust air. The condensed water is collected.

20 Claims, 2 Drawing Sheets

(51) Int. Cl.
*H01M 8/04701* (2016.01)
*H05K 7/20* (2006.01)

(58) Field of Classification Search
CPC ......... H01M 8/04014; H01M 8/04074; H01M 8/04828; H05K 7/20745; H05K 7/20718; B01D 5/0057; B01D 5/0003; B01D 5/0075; Y02E 60/50
See application file for complete search history.

(56) References Cited

U.S. PATENT DOCUMENTS

| | | | |
|---|---|---|---|
| 9,769,960 B2 | 9/2017 | LeFebvre et al. | |
| 2010/0154448 A1* | 6/2010 | Hay | F24F 1/0067 62/119 |
| 2012/0073783 A1* | 3/2012 | Nair | H05K 7/20745 165/53 |
| 2012/0077427 A1 | 3/2012 | Wei | |
| 2013/0163192 A1* | 6/2013 | Ballantine | H05K 7/20763 361/679.48 |
| 2013/0340458 A1* | 12/2013 | Shaw | H05K 7/208 29/890.03 |
| 2017/0347499 A1* | 11/2017 | Ross | F24F 11/63 |
| 2018/0045599 A1* | 2/2018 | Larach | G08B 25/08 |

OTHER PUBLICATIONS

Wahlroos, et al., "Future Views on Waste Heat Utilization—Case of Data Centers in Northern Europe", In Journal of Renewable and Sustainable Energy Reviews, vol. 82, Issue 2, Feb. 2018, pp. 1749-1764.

"International Search Report and Written Opinion Issued in PCT Application No. PCT/US19/030243", dated Aug. 20, 2019, 13 Pages.

* cited by examiner

WATER SCAVENGING SYSTEM FOR DATACENTER COOLING SYSTEMS

CROSS-REFERENCE TO RELATED APPLICATIONS

This application claims the benefit of and priority to U.S. Provisional Patent Application Ser. No. 62/665,971 filed on May 2, 2018 and entitled "WATER SCAVANGING SYSTEM FOR DATACENTER COOLING SYSTEMS," which application is expressly incorporated herein by reference in its entirety.

BACKGROUND

Background and Relevant Art

Computing resources are often deployed in a number of different environments. For example, computing resources may be deployed in corporate environments in well-developed societies. In these cases, there are typically plenty of resources to deploy and operate the computing resources. For example, often computing resources require complex and robust cooling systems. Some of these complex and robust cooling systems may use water for evaporative cooling or by circulating water through a radiator. In resource rich environments, where water is readily available, few if any challenges are experienced due to the need for water.

However, in other environments where water is not readily available, the need for water for cooling can present significant challenges. Water may not be available for a number of different reasons. For example, in some locations water is simply not available. For example, consider a case where a server farm or server container is deployed in a remote desert environment not having access to the quantities of water needed to accomplish appropriate cooling. Alternatively or additionally, water may be available but may be prohibitively expensive for use in cooling applications. Thus, water may be generally unavailable or prohibitively expensive for a number of different reasons including climate reasons, geopolitical reasons, business reasons, etc. In general, resources are constrained in many situations. And in particular, water resources can be constrained for a number of different reasons such as those illustrated above, or others.

Other resources may also be constrained. For example, many environments may not have access to electricity from established power grid. This may be due to geopolitical reasons, environmental reasons, emergency situation reasons, or for other reasons. Alternatively or additionally, electrical power may be available but prohibitively expensive.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a method that includes acts for cooling a first device and second device in a fashion to produce water. The method includes collecting environmental air from an environment. The environmental air is used to cool a first device. Cooling the first device generates first device exhaust air produced from the environmental air. The first device exhaust air is provided to a first device portion of a heat exchanger. At a second device portion of the heat exchanger, thermally coupled to the first device portion of the heat exchanger, second device exhaust air generated by cooling a second device is received. At the heat exchanger, the first device exhaust air is used to cool the second device exhaust air to a dew point, causing condensed water to be created from the second device exhaust air. The condensed water is collected.

Another embodiment includes a system for cooling a first device and second device in a fashion to produce water. The system includes a first ambient air intake for collecting environmental air from an environment. A first cooling apparatus is coupled to the ambient air intake and thermally coupled to the first device. The first cooling apparatus is configured to cool the first device. Cooling the first device generates first device exhaust air produced from the environmental air. A heat exchanger is coupled to the first cooling apparatus to receive the first device exhaust air to a first device portion of the heat exchanger. A second cooling apparatus, for cooling a second device, is coupled to a second device portion of the heat exchanger which is thermally coupled to the first device portion of the heat exchanger. The second cooling apparatus is configured to generate second device exhaust air by cooling a second device. The heat exchanger, using the first device exhaust air to cool the second device exhaust air to a dew point, is configured to cause condensed water to be created from the second device exhaust air. A reservoir is coupled to the heat exchanger, and configured to collect the condensed water.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein implement a system that is able to perform cooling functionality, and as part of the cooling functionality to recover water. The recovered water can address issues related to areas and situations where water is a constrained resource, such as for example due to the lack of water and/or the prohibitively expensive nature of water. In general, embodiments use cooling exhaust from a first device to cool cooling exhaust from a second device such that the cooling exhaust from the second device reaches a dew point causing water to be formed from the cooling exhaust from the second device. This water can be collected and used in any appropriate fashion. In some novel and unique aspects of the invention, the collected water can actually be used for cooling the first device.

Figure 1:
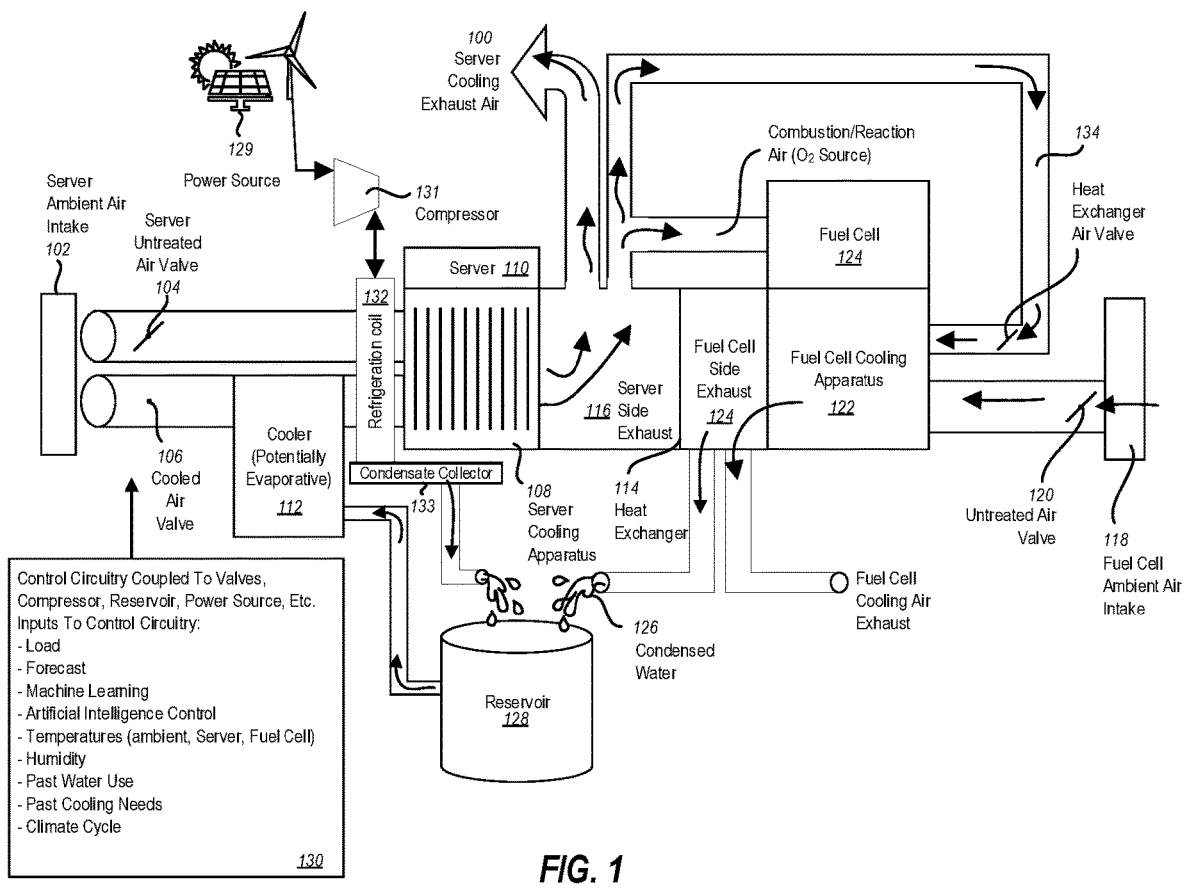
FIG. 1 illustrates a cooling system for cooling two different systems and recovering water from the cooling system.

Reference is now made to FIG. 1, which illustrates a system 100. The system 100 includes a server ambient air intake 102. This may include appropriate fans or other devices to move air for cooling a server 110. The system 100 further includes a server untreated air valve 104 and a cooled air valve 106. The server untreated air valve 104 allows air collected from the server ambient air intake 102 to be directed to server cooling apparatus 108. For example, the server cooling apparatus 108 may be server rack cooling device for a set of servers 110. The cooled air valve 106 controls ambient air from the ambient air intake 102 through a cooler 112.

In the example illustrated, the cooler 112 is an evaporative cooler that uses water to cool the air ambient air which is then provided to the server cooling apparatus 108.

Other embodiments may alternatively or additionally include a compressor 131. The compressor 131 is powered by a power source 129. The power source 129 may include one or more of a number of different sources. In some embodiments, the power provided by the power source 129 is provided by one or more renewable sources. For example, the power source 129 may include solar panels, windmills, wave power generators, etc. Note that in some embodiments, the compressor 131 may be powered by the fuel cell 124, described in more detail below.

The compressor 131 supplies a refrigeration coil 132 placed before the server cooling apparatus 108 in the ambient air stream. The coil 132 is optimized to condense water vapor, using the condensate collector 133, from the ambient air stream before sending the air to the first device, i.e., the server cooling apparatus 108.

The compressor 131 and refrigeration coil 132 are controlled by the control circuitry 130, which may include machine learning and artificial intelligence hardware and/or software, including processors, memory, programmatic code executable by the hardware to implement programs to extract water from the server ambient air intake 102 when outdoor temperature and humidity conditions are most productive and most economical, taking into account the cost of electricity, the ambient temperature and absolute humidity, water production by the heat exchanger 114, water levels in the reservoir 128 and the operating conditions of the server 110 and fuel cell 124.

Some embodiments use an unsupervised, neural network approach to optimization water production. For example, some embodiments may use International Weather for Energy Calculation (IWEC) files for weather data, available from ASHRAE, of Atlanta, Ga. This allows for the machine learning and artificial intelligence control in the control circuitry 130 to be trained for almost any location in the world.

Stored data with respect to cost of electricity at various facilities may additionally or alternatively be used to train the machine learning and artificial intelligence control in the control circuitry 130. The unsupervised portion of the machine learning may be implemented for unknown variables such as water production by the heat exchanger 114 (discussed in more detail below), water levels in the reservoir 128 and the operating conditions of the fuel cell 124. In some embodiments, machine learning models in the control circuitry are configured to optimize using the refrigeration coil 132 when financially feasible or advisable to do so. That is, an improved system is created where energy resources are consumed efficiently. For example, when water for cooling can be collected in a cost-efficient way, the system 100 collects water which can be used to further cool the system 100. Thus, the system 100 can implement a more efficient cooling system as compared to previous systems.

Operation of the refrigeration coil 132 is optimized for maximum production using real time and historical local weather conditions. The real-time data about the absolute humidity will tell the machine learning program in the control circuitry 130 whether it is efficient to run the water collection portions of the system 100, what refrigerant pressure to operate the compressor 131 and refrigeration coil 132, what condensation and exhaust temperatures to target for a given time period, etc. Embodiments can use machine learning and artificial intelligence as described herein to update ideal temperature, humidity, etc., condition for producing water, and adjust compressor pressure, evaporator valve settings, and final coil temperature to optimize water production.

In some embodiments, the refrigeration coil 132 is controlled by machine learning and artificial intelligence programs to extract water from the server ambient air intake 102 only when renewable energy is available. For example, the power source 129 may include one or more renewable energy sources. The compressor 131 may be coupled to the control circuitry 130. The control circuitry 130 may be configured to cause the compressor 131 to be powered by renewable energy sources when available and to disable the compressor 131 when renewable energy sources are not available.

Water condensing from the air stream passing through the refrigeration coil 132 is collected in the condensate collector 133 and transferred to the reservoir 128.

After the ambient air and the cooled air is used to cool the servers 110, the air is provided to a heat exchanger 114. The heat exchanger 114 includes a server-side exhaust 116. The air is provided to the server-side exhaust 116.

Meanwhile, ambient air is also taken in for a fuel cell at a fuel cell ambient air intake 118. This air is controlled by a fuel-cell untreated air valve 120. This allows air to be directed to a fuel-cell cooling apparatus 122. The fuel-cell cooling apparatus 122 cools a fuel-cell 124. Note that the fuel-cell 124 may also address resource constraints. For example, the fuel-cell may provide electricity for powering the servers 110, the compressor 131, or other equipment. This can be used when electrical power is unavailable from an infrastructure grid, when renewable power is unavailable (e.g., in cloudy conditions, windless conditions, or the like), or when power is prohibitively expensive in a location or environment.

After the air is used to cool the fuel-cell cooling apparatus 122, the air is provided to a fuel-cell side 124 of the heat exchanger 114. The server-side exhaust air is used by the heat exchanger 114 to cool the fuel-cell side exhaust air. In particular, the server-side exhaust air is used to cool the fuel-cell side exhaust air down to a dew point causing condensed water 126 to be formed. The condensed water 126 can be stored in the reservoir 128. The water stored in the reservoir 128 can be used for any suitable purpose, however, in the example illustrated in FIG. 1, the water is used to cool ambient air by the cooler 112.

FIG. 1 further illustrates some additional details. In particular, the server-side exhaust air can be used for a number of different purposes. For example, the server-side exhaust air can be used as combustion air for the fuel-cell 124. Alternatively or additionally, portions of the server-side exhaust air can actually be used as cooling air for the fuel-cell cooling apparatus 122. Note that the server-side exhaust air is cooler in temperature than the fuel-cell side exhaust air. Portions of the server-side exhaust air can be expelled out of the system as shown in FIG. 1.

FIG. 1 further illustrates control 130 circuitry coupled to the various valves, the compressor 131, the power source 129, the reservoir 128, and the heat exchanger 114 shown in FIG. 1. The control circuitry 130 can be used to control the various components of the system to control temperatures, airflows, and other factors. In some embodiments, the control circuitry 130 is configured to cause the system 100 to collect a determined amount of water in the reservoir 128. In particular, the control circuitry 130 may be configured to collect only a sufficient amount of water (within some predetermined threshold) to perform some particular function. For example, the control circuitry 130 may be configured to allow an amount of water to be collected that is sufficient to perform the cooling by the cooler 112 without producing an excessive amount of water according to some predetermined threshold for excessiveness.

The control circuitry may use various factors to determine how much water should be produced. For example, the control circuitry may be able to identify the load on the server 110 or the fuel-cell 124. Alternatively or additionally, the control circuitry 130 may use weather forecasting information. Alternatively or additionally, the control circuitry 130 may use temperatures, including ambient temperatures, server temperatures, fuel-cell temperatures, etc. Alternatively or additionally, the control circuitry 130 may use humidity information. Alternatively or additionally, the control circuitry 130 may use past water usage information. Alternatively or additionally, the control circuitry may use past cooling needs information. Alternatively or additionally, the control circuitry 130 may use information related to climate cycles in the location where the system 100 is deployed. Alternatively or additionally, the control circuitry 130 may use machine learning information.

As noted above, certain machine learning and/or artificial intelligence components may be implemented in the control circuitry 130 such as an unsupervised neural network using previously collected weather data, energy costs, etc., to train the system with respect to unknown variables such as water production, component temperatures, gas pressures, and the like to optimize the system to produce water when efficient to do so as determined by a measure of the value of the water as compared to the resources needed to be expended to collect the water.

Figure 2:
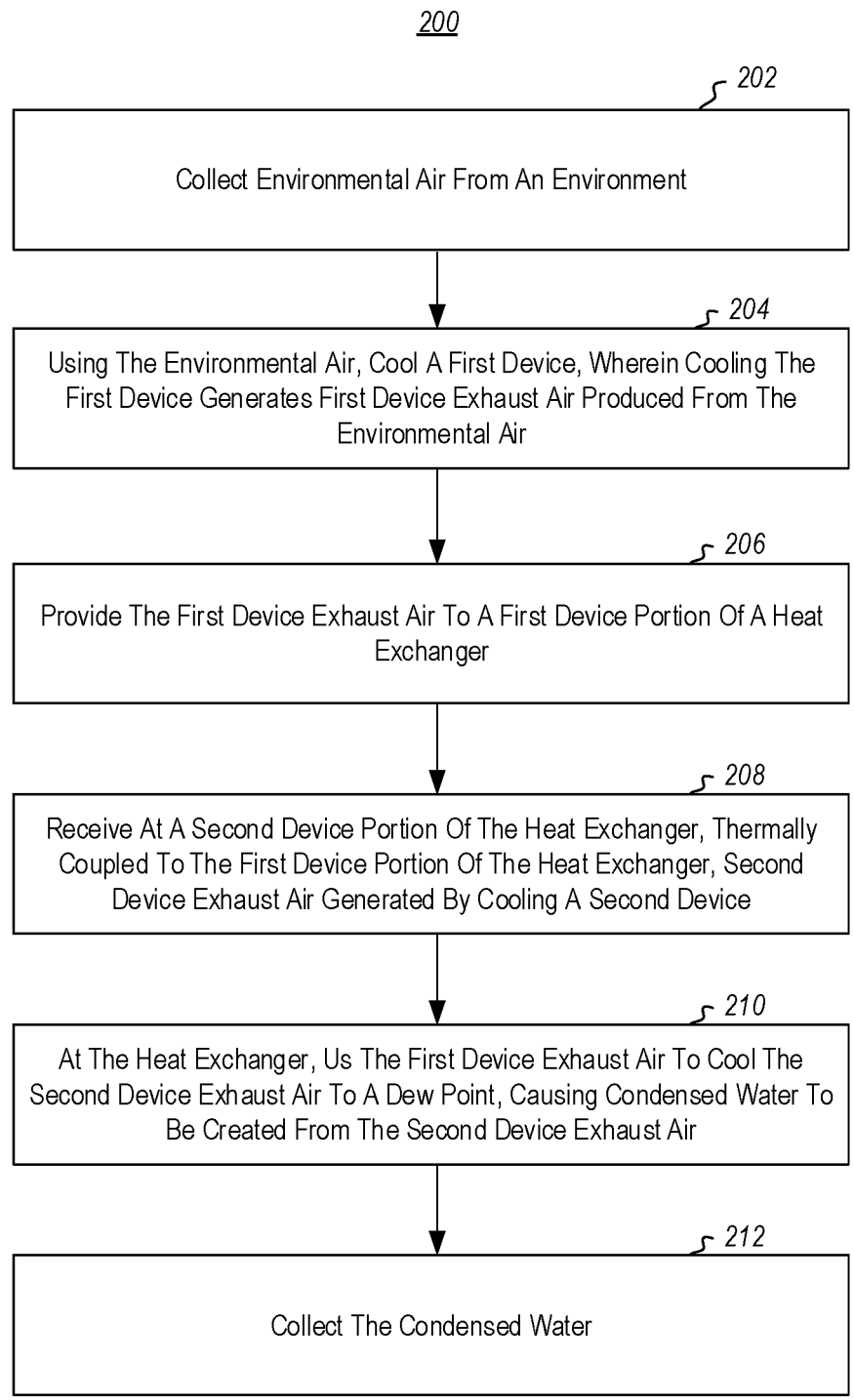
FIG. 2 illustrates a method of cooling devices to generate water.

Referring now to FIG. 2, a method 200 is illustrated. The method 200 includes acts for cooling a first device and second device in a fashion to produce water. The method includes collecting environmental air from an environment (act 202). For example, as illustrated in FIG. 1 server ambient air intake 102 and fuel-cell ambient air intake 118 can be used to collect ambient environmental air.

The method further includes using the environmental air, cooling a first device (act 204). In the example illustrated in FIG. 1, the first device is the server 110. Cooling the first device generates first device exhaust air produced from the environmental air.

The method further includes providing the first device exhaust air to a first device portion of a heat exchanger (act 206). FIG. 1 illustrates server side exhaust air being provided to the server-side exhaust 116 portion of the heat exchanger 114. The first device portion of the heat exchanger may include various first coils, plates, heat pipes, and/or other heat conductive elements.

The method further includes receiving at a second device portion of the heat exchanger (e.g., second coils, plates, heat pipes, and/or other heat conductive elements), thermally (e.g., conductively) coupled to the first device portion of the heat exchanger, (e.g., the first coils, plates, heat pipes etc.) second device exhaust air generated by cooling a second device (act 208). FIG. 1 illustrates fuel cell exhaust air provided to the fuel-cell side exhaust 124 of a heat exchanger 114, where the fuel-cell side exhaust 124 is coupled to the server side exhaust 116.

The method further includes at the heat exchanger, using the first device exhaust air to cool the second device exhaust air to a dew point, causing condensed water to be created from the second device exhaust air (act 210). FIG. 1 illustrates condensed water 126 produced.

The method further includes collecting the condensed water (act 212). FIG. 1 illustrates condensed water 126 collected in the reservoir 128.

The method may be practiced where cooling the second device exhaust air to a dew point is performed in a fashion to control the amount of water condensed so as to condense a pre-determined amount of water. The pre-determined amount may be a discrete amount (e.g., 1,000 gallons). In an alternative or additional embodiment, the pre-determined amount may be a rate of production (e.g., 1,000 gallons per hour, either instantaneous or aggregated over time). The predetermined amount of water may be based on expected load of the first device.

The predetermined amount of water may be based on temperatures (expected or current) of at least one of the first device, the second device, or the environmental air.

The predetermined amount of water may be based on humidity.

The predetermined amount of water may be based on historical water usage. For example, water may be collected based an amount that has been previously used for cooling.

The predetermined amount of water may be based on historical cooling needs.

The predetermined amount of water may be based on anticipated climate cycle (i.e., a weather forecast).

The predetermined amount of water may be based on historical climate cycle.

The predetermined amount of water may be based on results of machine learning.

The method may be practiced where receiving at a second device portion of the heat exchanger the second device exhaust air is performed by controlling second device cooling air used to cool the second device, producing the second device exhaust air, in a fashion to control the amount of water condensed so as to condense a pre-determined amount of water. For example, controlling second device cooling air may include selectively mixing additional environmental air with first device heat exchanger air, produced when the first device exhaust air is used to cool the second device exhaust air, to produce the second device cooling air having a predetermined temperature (or other characteristic, such as humidity).

The method may further include cooling at least a portion of the environmental air (to get the air to a desired temp) prior to using the environmental air to cool the first device.

FIG. 1 illustrates the cooler 112 and/or the compressor 131 and refrigeration coil 132 being used to accomplish this functionality. In some embodiments, cooling at least a portion of the environmental air comprises cooling at least a portion of the environmental air using evaporative cooling using the collected, condensed water. In some embodiments, cooling the second device exhaust air to a dew point is performed in a fashion to control the amount of water condensed so as to condense an amount of water that is within a predetermined threshold of an amount of water expected to be used for the evaporative cooling. In particular, some embodiments may be configured so as to not produce a large excess amount of water.

The method may further include using first device heat exchanger air, produced when the first device exhaust air is used to cool the second device exhaust air, to produce second device cooling air used to cool the second device, which produces the second device exhaust air. For example, as illustrated in FIG. 1, air may be directed from the server side exhaust 116 to the fuel cell cooling 122 through the path 134.

The method may further include mixing additional environmental air with first device heat exchanger air, produced when the first device exhaust air is used to cool the second device exhaust air, to produce second device cooling air used to cool the second device (producing the second device exhaust air).

The method may further include using first device heat exchanger air, produced when the first device exhaust air is used to cool the second device exhaust air, to produce reaction air and providing the reaction air to the second device, where the reaction air is used in at least one of a chemical reaction or combustion by the second device. Thus, as illustrated in FIG. 1, server side exhaust air can be fed into the fuel cell 124 for use by the fuel cell 124.

Having just described the various features and functionalities of some of the disclosed embodiments, embodiments may be implemented computer system that may be used to facilitate the operations described herein. It will be appreciated that, in some instances, aspects of the system 100 shown in FIG. 1 and the computer system can be used in combination to carry out the embodiments described herein. In some embodiments, the computer system may be implemented as part of the control circuitry 130.

The computer system may take various different forms. For example, the computer system may be a distributed system that includes one or more connected computing components/devices. Accordingly, the computer system may be embodied in any form. By way of example, the computer system may include a desktop computer, a laptop, a tablet, a mobile phone, server, data center and/or any other computer system.

In its most basic configuration, the computer system includes various different components. For example, the computer system may include at least one hardware processing unit (aka a "processor"), input/output (I/O) interfaces, graphics rendering engines, one or more sensors, and storage. More detail on the hardware processing unit will be presented below.

The storage may be physical system memory, which may be volatile, non-volatile, or some combination of the two. The term "memory" may also be used herein to refer to non-volatile mass storage such as physical storage media. If the computer system is distributed, the processing, memory, and/or storage capability may be distributed as well. As used herein, the term "executable module," "executable component," or even "component" can refer to software objects, routines, or methods that may be executed on the computer system. The different components, modules, engines, and services described herein may be implemented as objects or processors that execute on the computer system (e.g. as separate threads).

The disclosed embodiments may comprise or utilize a special-purpose or general-purpose computer including computer hardware, such as, for example, one or more processors (such the hardware processing unit) and system memory (such as storage), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are physical computer storage media. Computer-readable media that carry computer-executable instructions are transmission media. Thus, by way of example and not limitation, the current embodiments can comprise at least two distinctly different kinds of computer-readable media: computer storage media and transmission media.

Computer storage media are hardware storage devices, such as RAM, ROM, EEPROM, CD-ROM, solid state drives (SSDs) that are based on RAM, Flash memory, phase-change memory (PCM), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

The computer system may also be connected (via a wired or wireless connection) to external sensors (e.g., one or more remote cameras, accelerometers, gyroscopes, acoustic sensors, magnetometers, thermometers, hygrometers, wind sensors, etc.).

A "network" is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. The computer system will include one or more communication channels that are used to communicate with the network. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RAM and/or to less volatile computer storage media at a computer system. Thus, it should be understood that computer storage media can be included in computer system components that also (or even primarily) utilize transmission media, although storage media and transmission media differ as described above.

Computer-executable (or computer-interpretable) instructions comprise, for example, instructions that cause a general-purpose computer, special-purpose computer, or special-purpose processing device to perform a certain function or group of functions (e.g., the processes described hereinabove with respect to the control circuitry 130). The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

Additionally, or alternatively, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-On-A-Chip Systems (SOCs), Complex Programmable Logic Devices (CPLDs), Central Processing Units (CPUs), and other types of programmable hardware.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of producing water, the method comprising:
    collecting environmental air from an environment;
    using the environmental air, cooling a first device, wherein cooling the first device generates first device exhaust air produced from the environmental air;
    providing the first device exhaust air to a first portion of a heat exchanger;
    receiving at a second portion of the heat exchanger, wherein the second portion of the heat exchanger is thermally coupled to the first portion of the heat exchanger, second device exhaust air generated by cooling a second device;
    at the heat exchanger, using the first device exhaust air to directly, as a result of being thermally coupled, cool the second device exhaust air to a dew point, causing condensed water to be created from the second device exhaust air; and
    collecting the condensed water.

2. The method of claim 1, wherein the step of cooling the second device exhaust air to a dew point is performed to condense a pre-determined amount of the condensed water.

3. The method of claim 2, wherein the predetermined amount of water is based on one or more of the following:
    expected load of the first device;
    temperatures of at least one of the first device, the second device, or the environmental air;
    humidity of the environmental air;
    historical water usage based on an amount of water that has been previously used for cooling;
    historical cooling needs;
    anticipated climate cycle where the first device or second device is located;
    historical climate cycle where the first device or second device is located; or
    machine learning.

4. The method of claim 1, wherein cooling a second device is performed using second device cooling air, the method further comprising controlling characteristics of the second device cooling air to cause condensation of a pre-determined amount of the condensed water.

5. The method of claim 4, wherein the step of controlling the characteristics of the second device cooling air comprises selectively mixing additional environmental air with air produced when the first device exhaust air is used to cool the second device exhaust air, to produce the second device cooling air having a predetermined temperature.

6. The method of claim 1, further comprising cooling a portion of the environmental air and using the cooled portion of the environmental air to cool the first device.

7. The method of claim 6, wherein cooling the portion of the environmental air comprises using evaporative cooling using the collected, condensed water.

8. The method of claim 7, wherein cooling the second device exhaust air to a dew point is performed to condense an amount of water that is within a predetermined threshold of an amount of water expected to be used for the evaporative cooling.

9. The method of claim 6, wherein cooling the portion of the environmental air comprises using a refrigeration coil, and condensate collector, to collect additional water.

10. The method of claim 1, further comprising using air produced when the first device exhaust air is used to cool the second device exhaust air to produce air used to cool the second device.

11. The method of claim 1, further comprising mixing additional environmental air with air produced when the first device exhaust air is used to cool the second device exhaust air to produce air used to cool the second device.

12. The method of claim 1, further comprising using at least a portion of the first device exhaust air to produce reaction air and providing the reaction air to the second device, where the reaction air is used in at least one of a chemical reaction or combustion by the second device.

13. A system for producing water, the system comprising:
    a first ambient air intake for collecting environmental air from an environment;
    at least one of a cooler, compressor, or refrigeration coil coupled to the ambient air intake and thermally coupled to a first device, and configured to cool the first device, wherein cooling the first device generates first device exhaust air produced from the environmental air;

a heat exchanger coupled to the cooler, compressor, or refrigeration coil to receive the first device exhaust air to a first portion of the heat exchanger;

an air intake configured to provide air for cooling a second device, coupled to a second portion of the heat exchanger which is thermally coupled to the first portion of the heat exchanger, causing second device exhaust air by cooling the second device;

wherein the heat exchanger is configured to cause condensed water to be created from the second device exhaust air, by using the first device exhaust air to directly, as a result of being thermally coupled, cool the second device exhaust air to a dew point; and a reservoir coupled to the heat exchanger, and configured to collect the condensed water.

14. The system of claim 13, further comprising control circuitry configured to control water production from the heat exchanger, wherein the control circuity receives as input, and uses at least one of the following: expected load of the first device; temperatures of at least one of the first device, the second device, or the environmental air; humidity of the environmental air; historical water usage; historical cooling needs; anticipated climate cycle; historical climate cycle.

15. The system of claim 14, wherein the control circuitry comprises an unsupervised neural network for determining when water should be produced.

16. The system of claim 13, wherein the cooler is an evaporative cooler coupled to the reservoir and the cooler, compressor, or refrigeration coil, and configured to cool the first device using the condensed water.

17. The system of claim 13, further comprising the compressor and refrigeration coil coupled to the compressor.

18. The system of claim 17, further comprising a condensate collector coupled to the refrigeration coil and the reservoir, the condensate collector being configured to collect water generated from the refrigeration coil and to provide the collected water to the reservoir.

19. The system of claim 17, further comprising a power source coupled the compressor, wherein the power source comprises one or more renewable energy sources, and wherein the compressor is coupled to the control circuitry, and wherein the control circuitry is configured to cause the compressor to be powered by renewable energy sources when available and to disable the compressor when renewable energy sources are not available.

20. A system for producing water, the system comprising:
one or more processors;
one or more computer-readable media having computer-executable instructions that are operable, when executed by the one or more processors, to cause the system to perform the following:
collect environmental air from an environment;
using the environmental air, cool a first device, wherein cooling the first device generates first device exhaust air produced from the environmental air;
provide the first device exhaust air to a first portion of a heat exchanger;
receive at a second portion of the heat exchanger, wherein the second portion of the heat exchanger is thermally coupled to the first portion of the heat exchanger, second device exhaust air generated by cooling a second device;
at the heat exchanger, use the first device exhaust air to directly, as a result of being thermally coupled, cool the second device exhaust air to a dew point, causing condensed water to be created from the second device exhaust air; and
collect the condensed water.

* * * * *